United States Patent [19]
Dietze et al.

[11] 3,943,218
[45] Mar. 9, 1976

[54] METHOD OF MANUFACTURING SHAPED HOLLOW BODIES

[75] Inventors: Wolfgang Dietze, Munich; Andreas Kasper, Garching-Hochbrueck, both of Germany

[73] Assignee: Siemens Aktiengesellschaft, Berlin & Munich, Germany

[22] Filed: June 14, 1973

[21] Appl. No.: 369,830

[30] Foreign Application Priority Data
June 15, 1972 Germany............................ 2229229

[52] U.S. Cl. ........................ 264/81; 264/83; 427/95
[51] Int. Cl. .............................................. B29c 13/04
[58] Field of Search ............ 117/106 A; 264/79, 80, 264/81, 82, 83; 427/93, 95

[56] References Cited
UNITED STATES PATENTS

| | | | |
|---|---|---|---|
| 2,925,357 | 2/1960 | Kothen | 117/106 A |
| 3,329,527 | 7/1967 | Harris | 117/106 A |
| 3,425,878 | 2/1969 | Deisin et al. | 117/106 A |
| 3,751,539 | 8/1973 | Reuschel et al. | 264/81 |

Primary Examiner—Donald J. Arnold
Assistant Examiner—John Parrish
Attorney, Agent, or Firm—Hill, Gross, Simpson, Van Santen, Steadman, Chiara & Simpson

[57] ABSTRACT

A method of producing shaped hollow semiconductor members, as of silicon or silicon carbide by depositing a select semiconductor material from a gaseous compound onto a heated graphite substrate which is first heat-treated above 1300° C. in a flowing gas atmosphere, preferably a mixture of $H_2$ and $SiHCl_3$ so as to modify the surface characteristics of the substrate whereby the deposited semiconductor material does not interact with the substrate so that the substrate may be reused.

2 Claims, 1 Drawing Figure

U.S. Patent  March 9, 1976  3,943,218
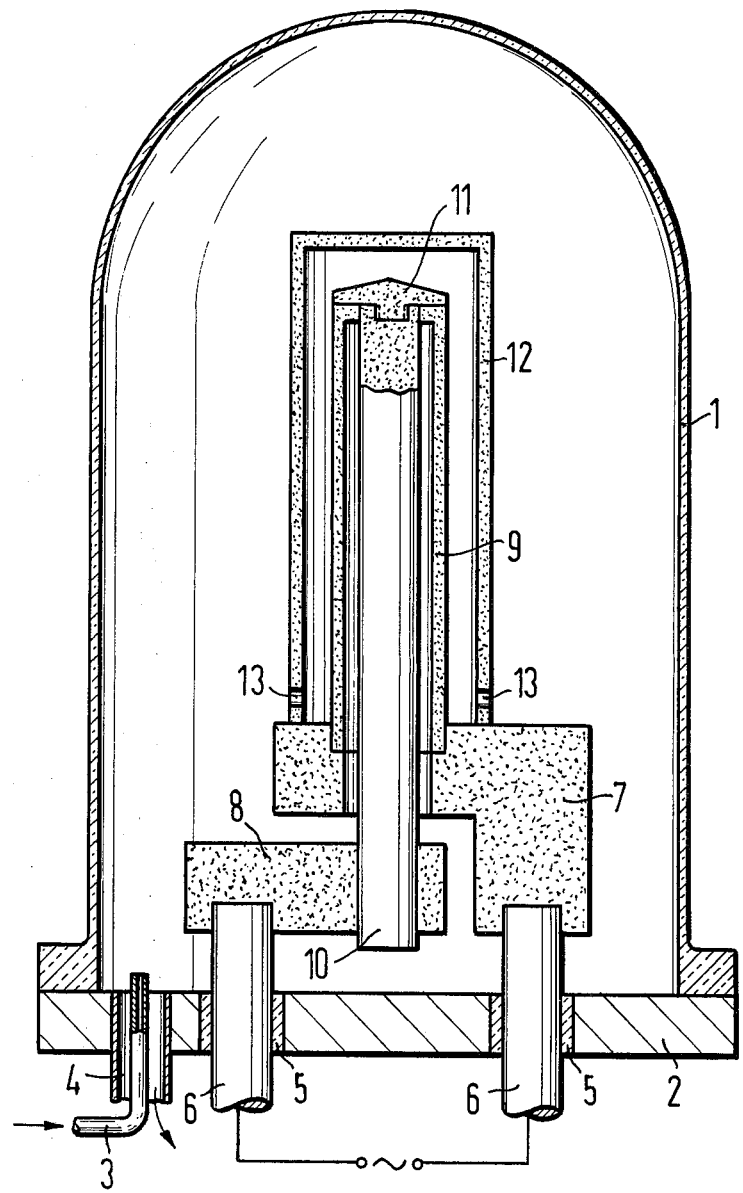

METHOD OF MANUFACTURING SHAPED HOLLOW BODIES

BACKGROUND OF THE INVENTION

1. Field of the Invention

The present invention relates to a process of forming shaped hollow semiconductor bodies, such as tubes composed of silicon or silicon carbide by depositing silicon or silicon carbide from a gaseous compound onto a heated substrate whereby the substrate is coated with a layer of, for example, silicon and, with the removal of the substrate, forms the desired hollow body.

2. Prior Art

German Auslegeschrift No. 1,805,970 teaches a method of manufacturing hollow bodies of silicon or silicon carbide by depositing silicon or silicon carbide from a gaseous compound onto the outer surface of a substrate composed of a heat-resistant material. After sufficient deposition, the substrate is removed, without destroying the hollow body defined by the deposited layer of silicon or silicon carbide. The substrate is preferably composed of graphite and is heated to the deposition temperature either inductively or by direct electrical conduction. The so-produced hollow silicon bodies are used in diffusion processes and are preferred over known diffusion ampules because they are of a higher purity. The preferred starting or depositing compound is silicochloroform ($SiHCl_3$), which is decomposed at about 1050° C. to 1250° C. in a hydrogen atmosphere. The substrate utilized in manufacturing, for example silicon tubes, is preferably composed of graphite and is itself in the form of a hollow body. The substrate is removed, after its outer surface has been coated with a silicon layer, by heating the coated substrate in an oxygen-containing atmosphere so that the substrate is burnt out without destroying the outer silicon body.

In such methods, the reuse of the graphite substrate for additional tube manufacturing has been possible only on a restricted scale because the surface structure of graphite is substantially modified during its initial use, for example by polycrystalline silicon or silicon carbide inclusions therein.

SUMMARY OF THE INVENTION

The invention provides a process of manufacturing shaped hollow bodies composed of semiconductive materials wherein the master substrate is reusable for a plurality of bodies.

It is a novel feature of the invention to heat-treat a graphite substrate at a temperature above 1300°C. in a select gas atmosphere and then deposit semiconductive material from a gaseous phase onto the heat-treated substrate.

BRIEF DESCRIPTION OF THE DRAWINGS

The single FIGURE is an elevated schematic sectional view of an apparatus embodiment useful in the practice of the invention.

DESCRIPTION OF THE PREFERRED EMBODIMENTS

The invention includes a method of manufacturing shaped hollow bodies of semiconductive materials, such as of silicon or silicon carbide by depositing a semiconductive material from a gaseous phase onto the outer surface of a heated substrate, for example composed of graphite so that the surface of the substrate becomes coated with a layer of the semiconductive material and when the substrate is removed, forms the desired hollow body. The substrate is, prior to semiconductive deposition thereon, subjected to heat-treatment at temperatures above 1300° C. in a select gas atmosphere for a period of time sufficient to alter its surface characteristics so that substantially no interaction occurs between the semiconductive material and the substrate material and the resultant substrate may be reused for the formation of a plurality of separate hollow bodies.

In preferred embodiments, the graphite substrate is heat-treated at temperatures in the range of about 1300° C. to 1600° C. The select gas atmosphere is a gas selected from the group consisting of a reducing gas (such as hydrogen or a mixture of hydrogen and nitrogen), an inert gas (such as a rare gas), a mixture of a major amount of reducing gas and a trace amount of $SiHCl_3$ (say at a mol ratio of 1:0.02), and mixtures thereof, and preferably comprises a stream of gas flowing at a rate in the range of about 200 to 300 l/hr. Preferably, the heat-treatment is continued for at least 15 minutes and in certain embodiments, the heat-treatment may continue for about 4 hours or longer.

The alteration of the graphite substrate may be explained by the vaporization of the semiconductive material, i.e., silicon or silicon carbide from the surface of the substrate. This is surprising since vapor pressure of silicon and particularly silicon carbide at temperatures around 1300° C. is still quite low. An obvious conclusion may be that what is actually involved is some sort of special modification of silicon carbide. During the heat-treatment or devaporization process, the graphite retains its original form and exhibits the kind of porous structure which is very favorable for subsequent silicon or silicon carbide depositions. Even graphite substrates which have not been used in the deposition process obtain an improved surface structure if heat-treated in accordance with the principles of the invention. This is particularly noticeable when the resultant semiconductive bodies are withdrawn from the substrate.

In a preferred embodiment, the heat-treatment of the substrate or carrier member is conducted in a hydrogen atmosphere which contains a trace (mol ratio 0.02:1) of silico-chloroform ($SiHCl_3$). It appears that the presence of additional silicon may promote the devaporization of silicon carbide from the substrate, possibly because of transport (migration) effects.

In another preferred embodiment, a graphite tube closed at one end is slipped over a tubular graphite substrate during the heat-treatment process. The outer tube provides thermal insulation and enables the inner graphite tube which is being regenerated, to be heated more uniformly and provides a decrease in the energy consumption.

The invention is conveniently practiced with an apparatus comprised of a hollow reaction housing, such as composed of quartz, and a base plate for sealing the interior of the housing from ambient atmosphere, such as composed of silver, and which includes gas inlet and outlet openings, support members and electrode means for transfer of energy. The supports are preferably composed of graphite and are connected to the electrode means, such as silver electrodes, through appropriate leadthrough means in the base plate, which are operationally connected with a suitable voltage source. Additionally, a graphite tube closed at its upper end and having openings adjacent its open or lower end is provided for mounting over the substrate undergoing treatment so as to provide improved heat concentration and insure economical heating.

Referring now to the drawings, a reaction housing in the form of a quartz bell jar 1, sealed in a gas-tight manner by a silver base plate 2 is shown. The base plate 2 contains openings 3 and 4, which function as a gas inlet and a gas outlet respectively. The base plate 2 also has leadthroughs 5 which allow current supply leads 6 to penetrate the interior of the bell jar 1. The leadthroughs 5 are composed, for example, of polytetrafluoroethylene. Above the leadthroughs 5, a pair of support members 7 and 8 are mounted onto the leads or electrodes 6, which are preferably composed of silver. The support members are preferably composed of graphite. Support member 7 carries a graphite tube 9, which is being regenerated and support member 8 carries a solid graphite rod 10, which is mounted coaxially within the tube 9 and attached thereto at its upper end by a suitable means, such as a graphite screw cap 11. A relatively large diameter graphite tube 12, which is closed at its upper end, is placed over the elements 9, 10 and 11 so that the heat developed during the regeneration process is concentrated on the tube 9. At the lower end of tube 9, near the rim thereof, gas inlet and outlet openings 13 are provided.

A select gas atmosphere, preferably composed of either pure hydrogen or hydrogen containing a trace of silico-chloroform is introduced into the quartz bell jar 1 through the gas inlet 3 at a flow rate of about 200 liters per hour. The electrodes 6 are then energized and the graphite tube is heated up to a temperature of about 1400° C. and maintained at this elevated temperature for a period of time, such as one hour. Any coating or the like on the graphite substrate prior to this heat-treatment, such as may be derived from a previous silicon or silicon carbide deposition process is completely removed after the devaporization process has been completed. Vapor or gas is continuously removed during the devaporization process from the bell jar via gas outlet 4, which may be connected to a suitable vacuum source (not shown). The heat-treated graphite substrate can then be immediately used for a further deposition operation, along the lines set forth earlier.

The shaped hollow bodies produced in accordance with the principles of the invention are pure and gas-tight, particularly the silicon bodies, and are exceptionally suited for use in diffusion operations in semiconductive work. The removal of silicon or silicon carbide from a graphite substrate pretreated in accordance with the invention is substantially simplified.

Although particular embodiments of the invention have been described and illustrated herein, it is recognized that modifications and variations may readily occur to those skilled in the art and consequently it is intended that the claims be interpreted to cover such modifications and equivalents.

We claim as our invention:

1. In a method of manufacturing a shaped hollow body composed of a semiconductor material selected from the group consisting of silicon or silicon carbide wherein said semiconductor material is deposited from a gas phase onto a heated graphite substrate so that the surface of said substrate becomes coated with a layer of said semiconductor material and then the substrate is removed for re-use while obtaining the desired shaped hollow body, the improvement comprising:

heat-treating the graphite substrate prior to deposition of a new layer of said semiconductor material thereon for at least 15 minutes at a temperature in the range of about 1300° C. to about 1600° C. in a gas stream composed of a gas selected from the group consisting of a hydrogen gas nitrogen, and a rare gas said stream having a flow rate in the range of about 200 to 300 liters per hour;

whereby the surface characteristics of said substrate are altered so as to substantially prevent interaction between graphite and said new layer of the semiconductor material and provide re-usability of the so-treated substrate in the formation of a plurality of shaped hollow bodies.

2. In a method as defined in claim 1 wherein said hydrogen includes a trace amount of silico-chloroform.

* * * * *